US006496028B1

(12) United States Patent
Manhaeve et al.

(10) Patent No.: US 6,496,028 B1
(45) Date of Patent: Dec. 17, 2002

(54) METHOD AND APPARATUS FOR TESTING ELECTRONIC DEVICES

(75) Inventors: Hans Manhaeve, St. Michiels Brugge (BE); Stopjakova Viera, Oravske Vesele (SK)

(73) Assignees: Interuniversitair Micro-Elektronica Centrum, Leuven (BE); Katholieke Hogeschool Brugge-Oostende (KHBO), Oostende (BE)

( * ) Notice: Subject to any disclaimer, the term of this patent is extended or adjusted under 35 U.S.C. 154(b) by 0 days.

(21) Appl. No.: 09/567,810

(22) Filed: May 9, 2000

Related U.S. Application Data

(60) Provisional application No. 60/133,611, filed on May 11, 1999.

(51) Int. Cl.[7] .......................... G01R 31/02; G01R 31/26

(52) U.S. Cl. .......................... 324/763; 324/765; 324/769

(58) Field of Search .......................... 324/158.1, 763, 324/765, 769; 307/456, 530

(56) References Cited

U.S. PATENT DOCUMENTS 6,087,843 A * 7/2000 Pun et al. .................. 324/765
6,118,293 A * 11/2000 Manhaeve et al. .......... 324/765
6,239,604 B1 5/2001 Van Lammeren et al.

FOREIGN PATENT DOCUMENTS

EP 0386804 12/1990
EP 0525421 3/1993

OTHER PUBLICATIONS

Segura, J. et al., "Built–in dynamic current sensor circuit for digital VLSI CMOS testing," *Electronics Letters*, 30(20):1668–1669, Sep. 29, 1994.

Argüelles, J., et al., "Dynamic $I_{dd}$ test circuit for mixed signal ICs," *Electronics Letters*, 30(6):485–486, Mar. 17, 1994.

Maidon, Y., et al., "3.3V CMOS built–in current sensor," *Electronics Letters*, 33(5):345–346, Feb. 1997.

McEuen, S., "Reliability Benefits of $I_{DDQ}$," *Journal of Electronic Testing: Theory and Applications*, 3(4):41–49, Dec., 1992.

(List continued on next page.)

*Primary Examiner*—Michael J. Sherry
*Assistant Examiner*—Paresh Patel
(74) *Attorney, Agent, or Firm*—McDonnell Boehnen Hulbert & Berghoff

(57) ABSTRACT

Test circuitry and test methods performing supply current measurement is presented. The test circuitry can be but is not limited to be on-chip. The supply current, also denoted test current, can be transient. The test circuitry and methods do not cause additional power supply voltage degradation. The test circuitry and methods provide detection capabilities for open defects, causing significant reduction of the transient supply current.

27 Claims, 8 Drawing Sheets

OTHER PUBLICATIONS

Mao, W., et al., "QUIETEST: A Quiescent Current Testing Methodology for Detecting Leakage Faults," Proc. of Inter. Conf. on Computer Aided Design, 1990. pp. 280–283.

Hawkins, C., et al., "Electrical Charateristics and Testing Considerations for Gate Oxide Shorts in CMOS ICs," Proc. of The 1985 Test Conf, Philadelphia, PA, pp. 544–555, 1985.

Maly, W., et al., "Built–in Current Testing," *IEEE Journal of Solid–State Circuits*, 27(3):425–428, Mar. 1992.

Henderson, C., et al., "The Behavior and Testing Implications of CMOS IC Logic Gate Open Circuits," Proc. of Inter. Test Conference 1991, pp. 302–310, Nov. 1991.

Champac, V., et al., "Electrical Model of the Floating Gate Defect in CMOS IC's: Implications of $I_{DDQ}$ Testing," *IEEE Trans on CAD of Integrated Circuits and Systems*, 13(3):359–369, Mar. 1994.

Su, S., et al., "Testing of Static Random Access Memories by Monitoring Dynamic Power Supply Current," *JETTA*, 3:265–278, 1992.

Su, S., et al., "Transient Power Supply Current Monitoring—A New Test Method for CMOS VLSI Circuits," *JETTA*, 6:23–43, Feb. 1995.

Tegethoff et al., "Opens Board Test Coverage: When is 99% Really 40%?" International Test Conference, Paper 12.2, pp. 333–339, 1996.

"X–Ray Systems Reveal Hidden Defects," *Test & Measurement Europe,* eds. J. Titus and B. Kerridge pp. 8–10, 12, 14, 16, 19. Aug.–Sep. 1998.

* cited by examiner

METHOD AND APPARATUS FOR TESTING ELECTRONIC DEVICES

REFERENCE TO RELATED APPLICATIONS

This application claims priority benefits to United States provisional application Ser. No. 60/133,611, filed on May 11, 1999. This application hereby incorporates by reference, in its entirety, United States provisional application Ser. No. 60/133,611, filed on May 11, 1999.

FIELD OF THE INVENTION

The invention relates to electronic device testing via supply current monitoring.

BACKGROUND OF THE INVENTION

In recent years, it has been shown that some physical defects, which do not affect the logic behavior of an electronic circuit or device (for instance a CMOS device) usually cannot be detected using voltage oriented test techniques. However, they often apparently reduce the reliability of the circuit. No doubt that testing is best performed using a combination of test techniques, with each method dedicated to detect a class of defects. Quiescent power supply current monitoring has been used to detect a variety of such defects See S. McEUEN, "Reliability benefits of $I_{DDQ}$", Journal of Electronic Testing: Theory and Applications, Vol. 3, No. 4, December, 1992, pp. 41–49; W. Mao, R. K. Gulati, D. K. Goel and M. D. Cilleti, "QUIETEST: A Quiescent Current Testing Methodology for Detecting Leakage Faults", Proc. of Inter. Conf. on Computer Aided Design, 1990, pp. 280–283; C. F. Hawkins and J. M. Soden, "Electrical characteristics and testing consideration for gate oxide shorts in CMOS ICs", Proc. of The 1985 Test Conf, Philadelphia, Pa., 1985, pp. 544–555; W. Maly and M. Patyra, "Built-in Current Testing", IEEE Journal of Solid State Circuits, Vol. 27, No. 3, March 1992, pp. 425–428.

Nevertheless, the efficiency of Quiescent Current Testing for detecting open defects presents some limitations due to the fact that these failures may prevent changes of the quiescent power supply current. See C. L. Henderson, J. M. Soden and C. F. Hawkins, "The behavior and testing implications of CMOS IC logic gate open circuits", Proc. of Inter. Test Conference, November, 1991, pp. 302–310; V. H. Champac, A. Rubio and J. Figueras, "Electrical model of the floating gate defect: Implications on $I_{DDQ}$ testing", IEEE Trans., 1994, CAD-13 (3), pp. 359–369.

Therefore, the transient power supply current testing (IDDT testing) [S-T. Su and R. Z. Makki, "Testing of SRAMs by Monitoring Dynamic Power Supply Current", JETTA, Vol. 3, 1992, pp. 265–278.][S-T. Su, R. Z. Makki and T. Nagle, "Transient Power Supply Current Monitoring—A New Test Method for CMOS VLSI Circuits", JETTA, Vol. 6, February 1995, pp. 23–43.] can be conveniently used to augment the existing test methods and to enhance the defect coverage. On the other hand, the on-chip measurement of the dynamic current presents a more complex issue than performing $I_{DDQ}$ testing.

So far, only a few transient built-in current (BIC) monitors have been proposed See J. Segura, M. Roca, D. Mateo and A. Rubio, "Built-in dynamic current sensor circuit for digital VLSI CMOS testing", Electronics Letters, Vol. 30, No. 20, Sept. 1994, pp. 1668–1669; J. Arguelles, M. Martinez, and S. Bracho, "Dynamic $I_{DD}$ test circuit for mixed-signal ICs", Electronics Letters, Vol. 30, No. 6, March 1994, pp. 485–486; Y. Maidon, Y. Deval, J. B. Begueret, J. Tomas, and J. P. Dom, "3.3V CMOS Built-In Current Sensor", Electronics Letters, Vol. 33, No. 5, February 1997, pp. 345–346.

In the state of the art, no current test monitors not influencing the operation of the DUT (Device Under Test) are available in the context of both static and dynamic (transient) currents and being either on-chip or off-chip.

The Philips Patent Application EP 0386804 A2 shows an arrangement for measuring the quiescent current of a digital circuit wherein the digital circuit under test is incorporated in the branches of a current mirror. Between the supply voltage and the voltage applied to said digital circuit under test an active element is found, resulting in a supplementary voltage drop, influencing the normal operation of the DUT.

The Texas Instruments Patent Application EP 0525421 A2 measures a voltage drop over a test object, and generates a voltage, being the voltage difference over two branches of a three branch current mirror. The connections of two branches of said three branch current mirror are made at an opposite side of the test object and are thus connected to another connection wire.

AIMS OF THE INVENTION

It is an aim of the invention to present an apparatus and methods for testing electronic devices via supply current measurements. Said apparatus and methods are not substantially influencing the normal operation of the electronic Device Under Test and can be implemented either on-chip or off-chip. Both static and dynamic (transient) currents are considered. Said devices can be digital, analog or mixed digital analog.

It is also an aim of the invention to present an apparatus and method wherein a fixed, non-time varying current is sent through a test object and thus influences the normal operation of the test object.

SUMMARY OF THE INVENTION

In a first aspect of the invention, a test device for testing an electronic device by measuring a supply current flowing in said electronic device is presented. Said supply current flows in a supply line from the powerline through the electronic device to ground. Powerline and ground can be reversed. Said test device comprises at least of a current mirror, having at least two branches. Each of said branches have at least one end. One end of the first branch is connected to said supply line at a first connection point. One end of the second branch is connected to said supply line at a second connection point. Said first and second connection point are located at a substantially different location of said supply line. Said current mirror is adapted for generating an output current. Said output current is related to said supply current. From the generated output current conclusions about occurrences of defects in said electronic device under test are drawn.

A typical operation of a current mirror known in the art is to generate currents in said branches of said current mirror in such a way that said current are proportional to each others. In the invention said typical operation of a current mirror is not exploited. Indeed the current mirror generates a output current being related to the supply current, therefore no proportionality between the currents in said branches is found while such a supply current flows. Still the terminology current mirror can be exploited as the circuitry still matches the current mirror layout.

In a first embodiment of this first aspect of the invention the test device further comprises circuitry for generating an offset voltage being applied to a first node of a capacitive element and means for measuring the voltage on a second node of said capacitive element with respect to a reference voltage, said means generating an output voltage. Said capacitive element is charged by said output current. From the measured voltage on said second node of said capacitive element conclusions about occurrences of defects in said electronic device under test are drawn.

In a second embodiment of this first aspect of the invention said test device is integrated with said electronic device on one integrated circuit.

In a third embodiment of this first aspect of the invention said test device comprises means for feeding said output voltage outside said one integrated circuit.

In a fourth embodiment of this first aspect of the invention said output voltage could also be combined with built-in self test circuitry, scan circuitry or boundary scan circuitry such that not necessary an additional output is required.

In a fifth embodiment of this first aspect of the invention said test device is adapted for testing a CMOS electronic device.

In a sixth embodiment of this first aspect of the invention said test device is adapted for testing an analog electronic device.

In a seventh embodiment of the invention said supply current is transient (dynamic).

In an eight embodiment of the invention said supply current is quiescent.

In a ninth embodiment of the invention said test device comprises means for discharging said capacitive element. Said means can be a switch.

In a tenth embodiment of the invention said reference voltage, exploited for the comparison, can either be applied from an external source using a dedicated input or be generated on board.

In a second aspect of the invention, a method for testing an electronic device by measuring a supply current flowing in said electronic device is presented. Said supply current flows from the powerline through the supply line and through the electronic device towards ground. Powerline and ground can be reversed. Said method comprises at least a step of generating an output current with a current mirror. Said current mirror comprises at least two branches. At least one end of each of said branches of said current mirror are connected to a different location of the supply line with connection lines. Said output current is related to said supply current. From said output current conclusions about occurrences of defects in said electronic device under test are drawn.

In a first embodiment of this second aspect of the invention in a further step an offset voltage is applied to a first node of a capacitive element. Then said capacitive element is charged with said output current. Said charging of said capacitive element results in a particular voltage on a second node of said capacitive element. Then an output voltage is generated by a means, comparing said voltage on said second node with a reference voltage. From said output voltage generated conclusions about occurrences of defects in said electronic device under test are drawn.

In a second embodiment of this second aspect said output voltage is feed outside the one integrated circuit on which at least said electronic device, said current mirror, the offset voltage generator and the output voltage generator are integrated.

In a third embodiment of this second aspect of the invention said supply current being measured in said methods is transient (dynamic).

In a fourth embodiment of this second aspect of the invention said supply current being measured in said methods is quiescent.

In a fifth embodiment of this second aspect of the invention in said methods comprise a step wherein said capacitive element is discharged.

In a sixth embodiment of this second aspect of the invention in said methods one repetitively switches from charging to discharging and vice-versa of said capacitive element.

In a seventh embodiment of said second aspect of the invention said electronic device is a CMOS device.

In an eight embodiment of said second aspect of the invention said electronic device is an analog device.

In a ninth embodiment of said second aspect of the invention the control of said switch which discharges the capacitor can be done by an externally applied signal fed in into the integrated circuit using a control input, or it can be controlled from an internal source such as but not limited to built-in self test circuitry, scan circuitry or boundary scan circuitry or dedicated circuitry.

In tenth an embodiment of said second aspect of the invention the evaluation of said output voltage signal can be done externally or internally using one of the following methods, but not limited to built-in self test circuitry, scan circuitry or boundary scan circuitry or dedicated circuitry.

DETAILED DESCRIPTION OF THE INVENTION

Several embodiments of the invention are described below but the invention is not limited hereto but solely by the claims.

A test device and method for testing electronic devices via supply current measuring or monitoring is presented. Said supply current can be either transient (dynamic) or static. Said test device can be incorporated on the electronic device under test on one integrated circuit (on-chip monitoring) or not (off-chip monitoring). Said test device can be an analog, digital or mixed analog digital device.

Figure 1:
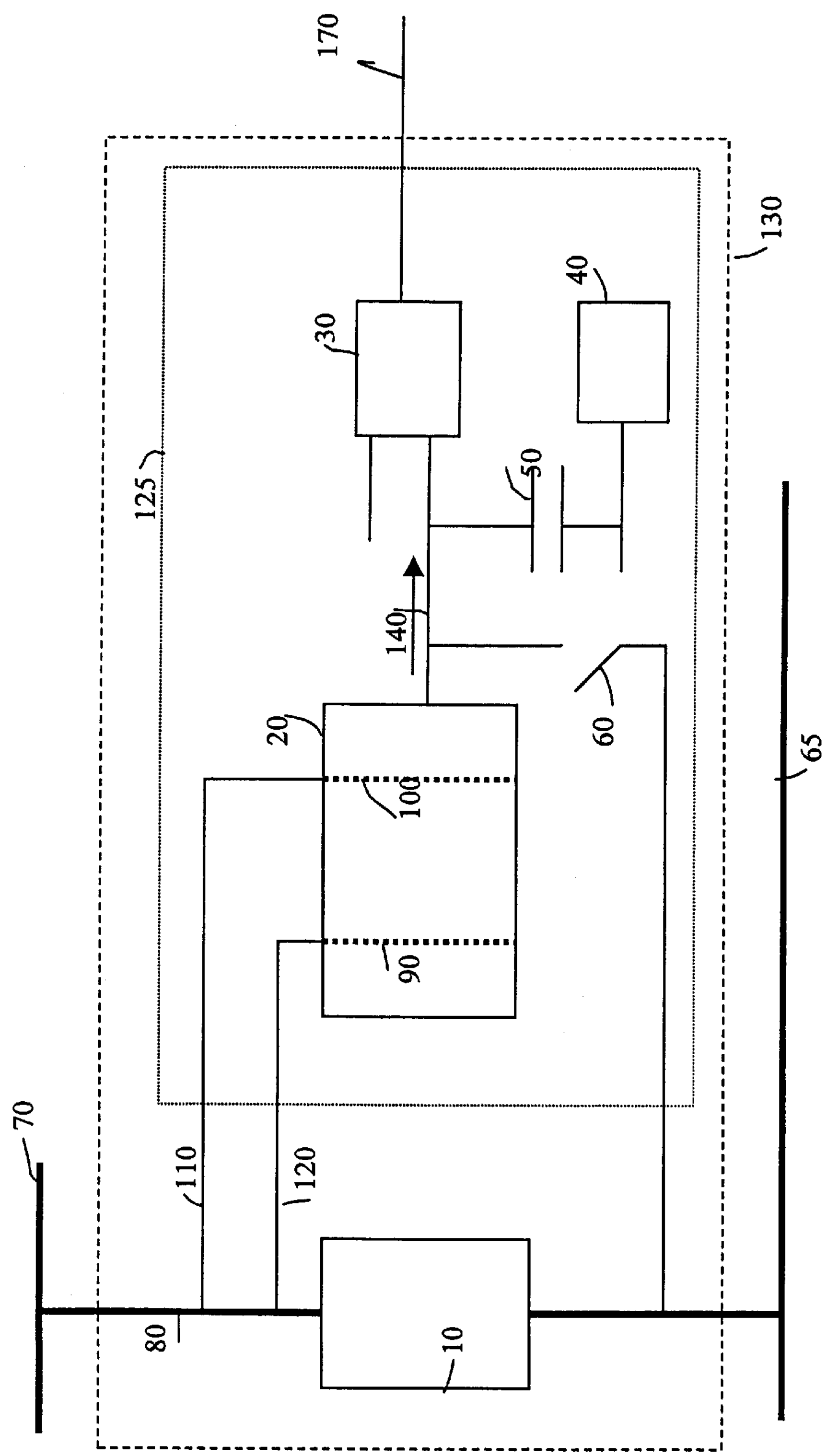
FIG. 1 is a schematic diagram showing a test device (20) for testing an electronic circuit (10) via supply current monitoring, wherein said test device at least comprising of a current mirror. Said current mirror having at least two branches (110), (120), being connected to the supply line (80). At least one end of each of said branches (110), (120), being connected to a different location of said supply line (80).

In a first aspect of the invention (one example of which is shown in FIG. 1), a test device (20) for testing an electronic device (10) by measuring a supply current flowing in said electronic device is presented. Said supply current flows in a supply line (80) from the powerline (70) through the electronic device (10) to ground (65). Powerline and ground can be reversed. Said test device 20 comprises at least a current mirror, being characterized by at least two branches (90), (100). At least one end of each of said branches are connected through connection lines (110), (120) to a different location of the supply line (80) to said electronic device. Said current mirror is adapted for generating an output current in line (140). Said output current is related to said supply current. Said test device can also be denoted as a current monitor. From said output current, conclusions about the occurrence of defects in said electronic device under test are drawn.

In a second aspect of the invention a method for testing an electronic device (10) by measuring a supply current flowing in said electronic device (10) is presented. Said supply current flows from the powerline through the supply line (80) and through the electronic device (10) towards ground (65). Powerline and ground can be reversed. Said method comprises at least a step of generating an output current (in line 140) with a test device (20) that includes at least a current mirror. Said current mirror comprises at least two branches (90), (100). At least one end of each of said branches of said current mirror are connected to a different location of the supply line (80) with connection lines (110), (120). Said output current in line (140) is related to said supply current in supply line (80). From said output current, conclusions about occurrence of defects in said electronic device are drawn.

In an embodiment of the invention, the introduced measurement principle makes use of the resistance of the supply connection (80); thus the monitor or test device and the testing methods presented do not necessarily cause any additional power supply voltage degradation. In said embodiment, the proposed monitor does not affect the normal operation or performance of the DUT (Device under Test).

In a further embodiment, the proposed approach thus takes advantage of the quite small parasitic resistance of the metallic interconnection, between the core of the device under test (DUT) and its VDD pad. Alternatively, the proposed approach may take advantage of the quite small parasitic resistance of the metallic interconnection between the core of the device under test (DUT) and its ground pad.

The developed current monitor or test device can be adapted such that advantage can be taken of the metal layer's parasitic resistance. It is known that the metal interconnections between the core of an electronic device (10) and its I/O pads, power supply and ground connection always induce a small parasitic resistance. This small resistance (assumed 10 mΩ–1 Ω range) of the supply line (80) can be used to sense supply currents. The developed current monitor should be sensitive enough such that a small voltage drop between the different connection points where said branches of said mirror are connected to said supply line results in an output current of said current mirror may be sensed.

In another embodiment of the invention, the introduced measurement principle via a current mirror can also be exploited when deliberately an additional resistance is added in said supply connection. When said additional resistance is small enough, a substantial disturbance of the operation of the device under test can be avoided.

Figure 2:
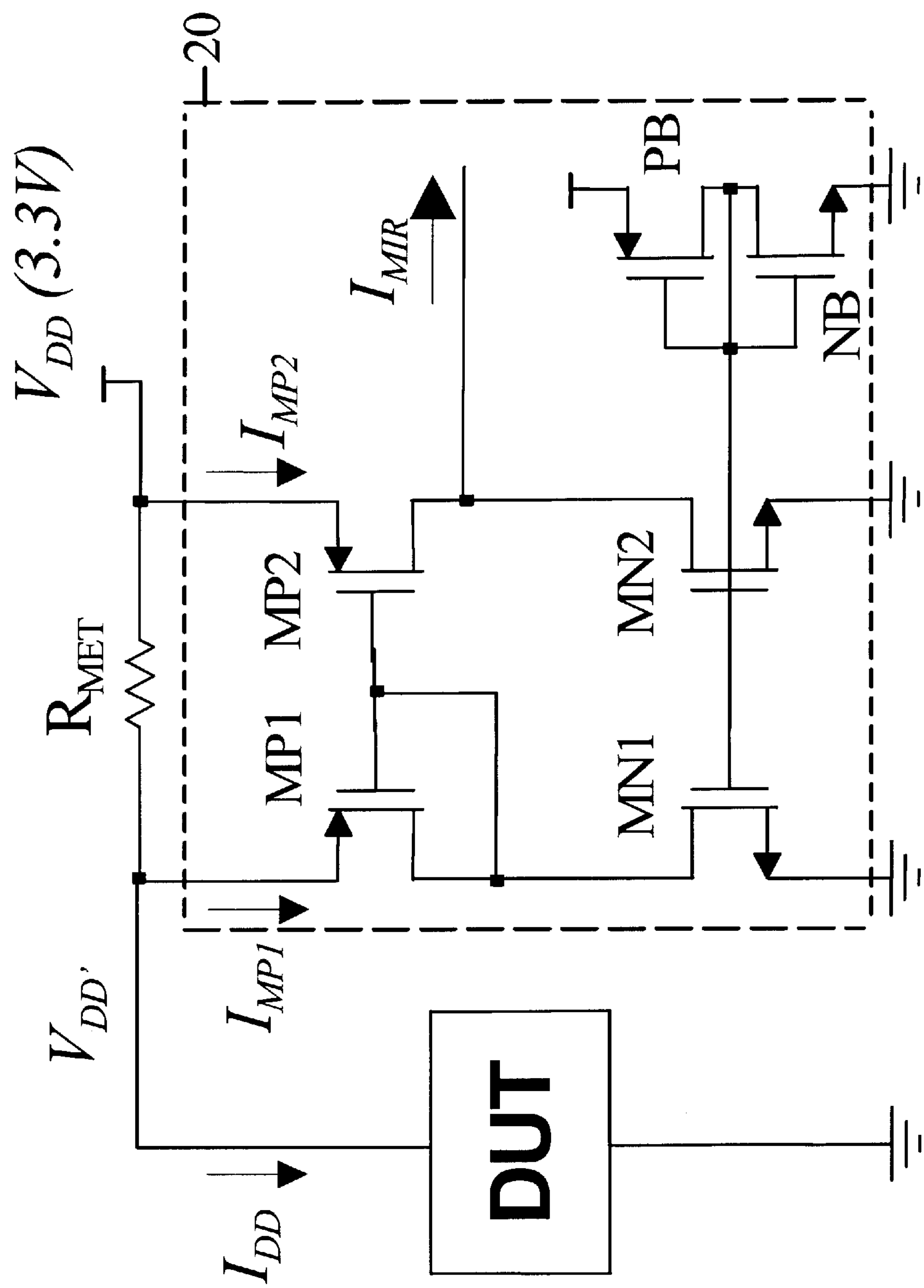
FIG. 2 is a schematic diagram showing the current mirror principle of current monitoring. Said current mirror generates an output current ($I_{MIR}$) being related to said supply current. Said output current is exploited as an indicator of potential defects in the device under test (DUT).
Figure 8:
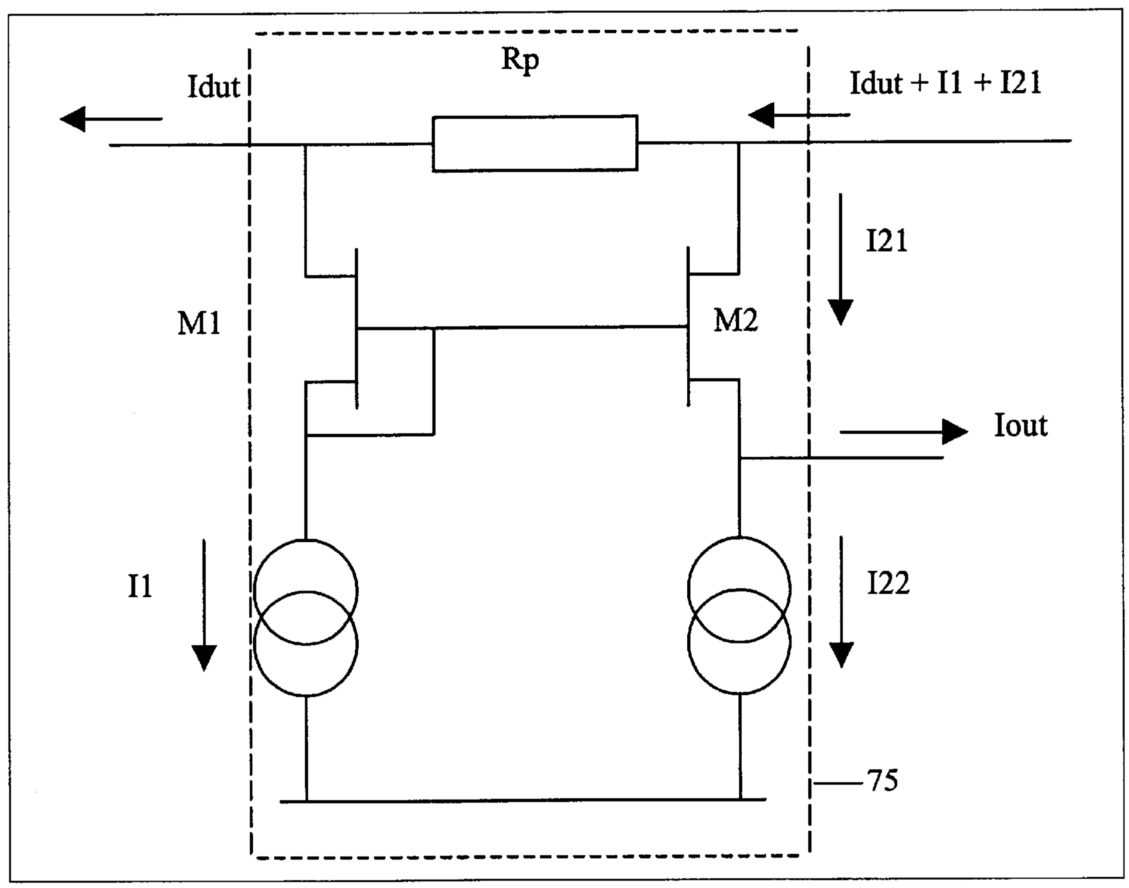
FIG. 8 shows a more detailed schematic of the current mirror in FIG. 2.

The measurement principle is further discussed for the parasitic resistance case, although the invention is not limited hereto. The Device Under Test (DUT) or electronic device is connected to the power supply VDD via a supply line (for example, as shown in FIG. 2). The supply current $I_{DD}$ (being static or dynamic), which flows through the DUT, provides a small voltage drop across the parasitic resistance $R_{MET}$. This voltage difference makes the current mirror of the test device (20), which comprises two branches, unbalanced. This imbalance implies a current $I_{MIR}$ at its output. The first branch includes transistors MP1 and MN1 while the second branch includes transistors MP2 and MN2. Specifically, $I_{MP1}$ is a constant current determined by the devices MN1 and the PB, NB transistor devices. As shown in FIG. 8, each branch includes a current source. And, each current source draws a fixed current through its related branch.

The current $I_{DD}$ through the metalization resistance sets the voltage $V_{DD}'$. $V_{DD}'$, together with the $I_{MP1}$, determine the source-gate voltage differential of MP1, which also sets the gate voltage of MP2. The gate-source voltage drop for MP2 is thus established, and determines the current $I_{MP2}$. When one selects the device MN2 in FIG. 2 such that only a current being equal to $I_{MP1}$ flows through MN2, the differential current $(I_{MP2}-I_{MP1})$ equals $I_{MIR}$.

As the current flow to the DUT increases, the $V_{DD}'$ decreases, and the gates of MP1 and MP2 correspondingly decrease. This results in an increase in the source-gate voltage drop on MP2, thereby increasing the current $I_{MP2}$. Because of the layout of FIG. 2, the current through MN2 does not increase. Rather, $I_{MIR}$ increases.

When both transistors MP1 and MP2 have the same dimensions, the current $I_{MIR}$ will be zero when $V_{DD}'$ equals $V_{DD}$. Note that in the above mentioned reasoning, the voltage drop across the parasitic resistance due to the current $I_{MP1}$ is neglected. A more elaborated reasoning is given subsequently.

The developed monitor or test device using the current mirror principle consists thus of an unbalanced current mirror that mirrors the supply current. The current mirror output (140) is thus related to said supply current $I_{DD}$.

Referring to FIG. 8, there is shown a more detailed schematic of FIG. 2. Rp is the resistance in the connection line. The resistance can take a variety of forms based on the connection line. In a preferred embodiment, the connection line is metal so that the resistance is based on $R_{MET}$, as shown in FIG. 2. Moreover, the current Idut in FIG. 8 is the current which is sent to the DUT. In analyzing the operation of the current mirror, the following situations can be considered:

1. Ideal Current Mirror, Ideal Connection (Rp=0, M1=M2, I22=I1)

In this case, since M1=M2, then I21=I1 and Iout=0, regardless of the presence of Idut.

2. Ideal Current Mirror, No Ideal Connection, No Idut (M1=M2, I22=I1, Rp ≠0, Idut=0)

If Rp is present, then I1 causes a voltage drop across Rp which is equal to Vp=I1 * Rp. As a result, Vgs(M1) [the gate to source voltage across transistor M1] will differ from Vgs(M2) with an amount equal to Vp, causing I21 to differ from I1 and hence an output current will flow equal to I21–I22=Iout. This Iout is to be seen as an offset current caused by the bias current (I1) needed to make the current mirror structure operational.

3. No Ideal Current Mirror, No Ideal Connection, No Idut (M1≠M2, I22 I1, Rp≠0, Idut=0)

If Rp is present, then I1 causes a voltage drop across Rp which is equal to Vp=I1 * Rp, as a result Vgs(M1) will differ from Vgs(M2) with an amount equal to Vp, causing I21 to differ from I1 and hence an output current will flow equal to I21–I22=Iout. The potential mismatch between M1 and M2 and between I1 and I22 might either compensate for Iout (no Iout flowing), decrease Iout or increase Iout. As for case 2, this Iout might be looked at as being an offset current.

4. Ideal Current Mirror, No Ideal Connection, Idut (M1=M2, I22=I1, Rp≠0, Idut≠0)

If Rp is present, then the current passing through Rp will cause a voltage drop across Rp which is equal to Vp=(I1+Idut) * Rp, as a result Vgs(M1) will differ from Vgs(M2) with an amount equal to Vp, causing I21 to differ from I1 and hence an output current will flow equal to I21–I22=Iout. This Iout consists of an offset current, caused by the bias current (I1) needed to make the current mirror structure operational, and an output current caused by the (additional) voltage drop created across Rp due to Idut.

5. No Ideal Current mirror, No Ideal Connection, Idut (M1≠M2, I22≠I1, Rp≠0, Idut≠0)

If Rp is present, then I1 in combination with Idut causes a voltage drop across Rp which is equal to Vp=(I1+Idut) * Rp, as a result Vgs(M1) will differ from Vgs(M2) with an amount equal to Vp, causing I21 to differ from I1 and hence an output current will flow equal to I21–I22=Iout. This output current consists of an offset current (as a result of I1) and an output current (caused by the voltage drop across Rp due to Idut). The potential mismatch between M1 and M2 and between I1 and I22 might either compensate for, decrease or increase the offset portion.

If the connection is ideal (Rp=0) (situation 1 as discussed above), the current mirror will be unable to accurately measure the supply current in the supply line. For a non-ideal connection (Rp=0), the operation of the current mirror is analyzed to determine its operation as an indicator of the supply current. In a preferred embodiment, the design of the current mirror is chosen so that it operates ideally. Thus, the parameters for the current mirror are chosen such that M1=M2, I22=I1 (situation 2 as discussed above). If current mirror is ideal (or considered to be sufficiently ideal), the DUT is analyzed for Idut that is not equal to zero (situation 4). In this manner, the Iout current generated is analyzed as an indicator of Idut.

If the current mirror is non-ideal (either due to design or due to inherent inaccuracy of the current mirror), the operation of the current mirror is first analyzed to determine its response (situation 3, the operation of the current mirror without an Idut current i.e., Idut=0). The current mirror may then be analyzed in order to determine its non-ideal properties so that when an Idut current is present (Idu≠0, situation 5), the current mirror indicates the amount of supply current.

Figure 3:
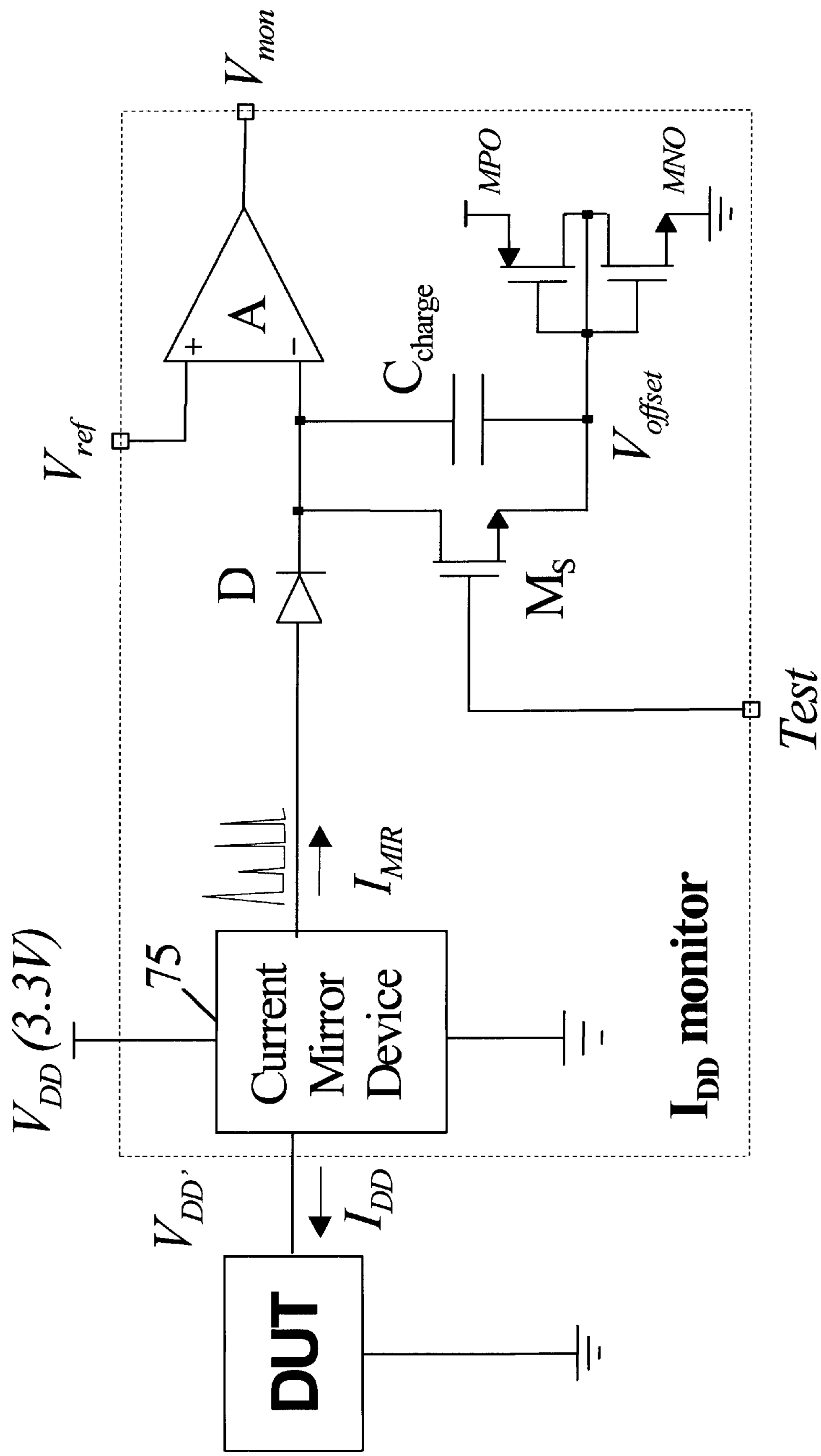
FIG. 3 is a schematic diagram showing one potential implementation of the $I_{DD}$ monitor, wherein said output current of said current mirror being exploited for charging a capacitive element ($C_{charge}$). The voltage on said capacitive element is compared to a reference voltage. The output voltage, designated as $V_{mon}$, resulting from said comparison is exploited as an indicator of potential defects in the device under test (DUT).

In one embodiment, as shown in FIG. 3, there is a current mirror device 75 which includes the current mirror and the parasitic resistance (as shown in FIG. 8). FIG. 3 further includes circuitry providing the quantification of the charge involved in the supply current via said current $I_{MIR}$, denoting the current mirror output current. This circuitry consists of a capacitor ($C_{charge}$), being charged by said current mirror output current and a differential amplifier (A), for measuring the voltage on said capacitance. Said capacitance can be replaced by any capacitive element. Said voltage on said capacitance is exploited for drawing conclusions about occurrence of defects in said electronic device under test.

In one embodiment, the test device further comprises circuitry (40) for generating an offset voltage being applied to a first node of a capacitive element (50) and means (30) for measuring the voltage on a second node of said capacitive element (50) with respect to a reference voltage, said means generating an output voltage (170). One example of the circuitry (40) for generating the offset voltage ($V_{offset}$ in FIG. 3) is shown as MPO and MNO. Moreover, one example of the capacitive element (50) is shown as $C_{charge}$ in FIG. 3. Further, one example of the means (30) for measuring the voltage on a second node of said capacitive element is the amplifier A in FIG. 3. Said capacitive element (50) is charged by said output current in line (140). In one embodiment, as shown subsequently in FIG. 3, the output voltage is represented by $V_{mon}$ and the output current in line (140) is represented by $I_{MIR}$.

In one embodiment, said test device further comprises a diode (D) and a switch ($M_s$) for discharging said capacitance or said capacitive element, as shown in FIG. 3 (the switch is shown as element 60 in FIG. 1). Control for switch ($M_s$) is by the input Test, as shown in FIG. 3.

In one embodiment, said test device further comprises a diode (D) and a switch ($M_s$) for decharging said capacitance or said capacitive element, as shown in FIG. 3 (the switch is shown as element 60 in FIG. 1). Control for switch ($M_s$) is by the input Test, as shown in FIG. 3.

In an embodiment, as shown in FIG. 3, the mirrored supply current $I_{MIR}$ passes through the diode D and charges the capacitor $C_{charge}$. Initially, in monitoring mode, the transistor $M_s$ is switched off so that the capacitor $C_{charge}$ is fully charged by the supply current and the resulting voltage is compared to the voltage reference $V_{ref}$ by the amplifier A. Then, the switch is closed to discharge the capacitor $C_{charge}$ and to ensure that before each transition, the input of the amplifier A is set to zero. In such an embodiment, one repetitively switches from charging to discharging. $V_{ref}$, in one embodiment, is input to the $I_{DD}$ monitor. Alternatively, $V_{ref}$ can be generated within the $I_{DD}$ monitor. Transistor $M_s$ is controlled by Test, which, in one embodiment, is an input to the $I_{DD}$ monitor.

In another embodiment, said discharging is not performed after every charging. As such, a cumulative voltage building up is realised on said capacitive element.

The capacitance of $C_{charge}$ is an important parameter of the design as its value determines the voltage drop across it. Additionally, the reference voltage is another important parameter that should be tuned with regard to the DUT being tested. These two parameters should be set according to the current behaviour (being transient or dynamic) of the particular circuit when no defects are present. In a defect-free circuit, the minimum voltage across the capacitor $C_{charge}$ will be:

$$V_{Cmin} = \frac{Q_{DEF-FREEmin}}{C_{charge}}$$

where $Q_{DEF\text{-}FREE\ min}$ is the minimum charge driven during a transition in a defect-free circuit. The value $V_{Cmin}$ represents the pass/fail level for the reference voltage $V_{ref}$. The offset in the output current $I_{MIR}$ requires the capacitor $C_{charge}$ and the switch $M_s$ to be connected to a voltage reference not to provide current flowing through the diode for a certain reference voltage. While performing transient current monitoring, said reference voltage can be determined to prevent current flowing through the diode during the quiescent state of the DUT. This voltage, denoted as $V_{offset}$, is given as follows:

$$V_{offset}=V_{out\_q}-V_{TD}$$

where $V_{out-q}$ is output voltage of the current mirror (for instance in the quiescent state of the DUT) and $V_{TD}$ is the threshold voltage of the diode D.

It is known that the current consumption of electronic circuits or devices (being analog or digital, for instance but limited to CMOS devices) exhibit sharp transient current peaks that appear during switching actions of the circuit. If an open defect is present, the transient current peaks of the defective circuit will differ from these of a defect-free one. In an embodiment of the invention, monitoring or measuring of transient or dynamic supply currents for testing of electronic devices is presented.

In a further embodiment of the invention, detection of variations in the transient supply current peaks is performed via the measurement of the charge involved. The basic idea used for the proposed transient monitor is based on a consideration that, in most cases, it is sufficient to check the circuit for presence or absence of the current peaks (related to a reference value) rather than to characterise and to compare the shape of the current pulses. Said transient monitor can be on-chip or off-chip.

Figure 4:
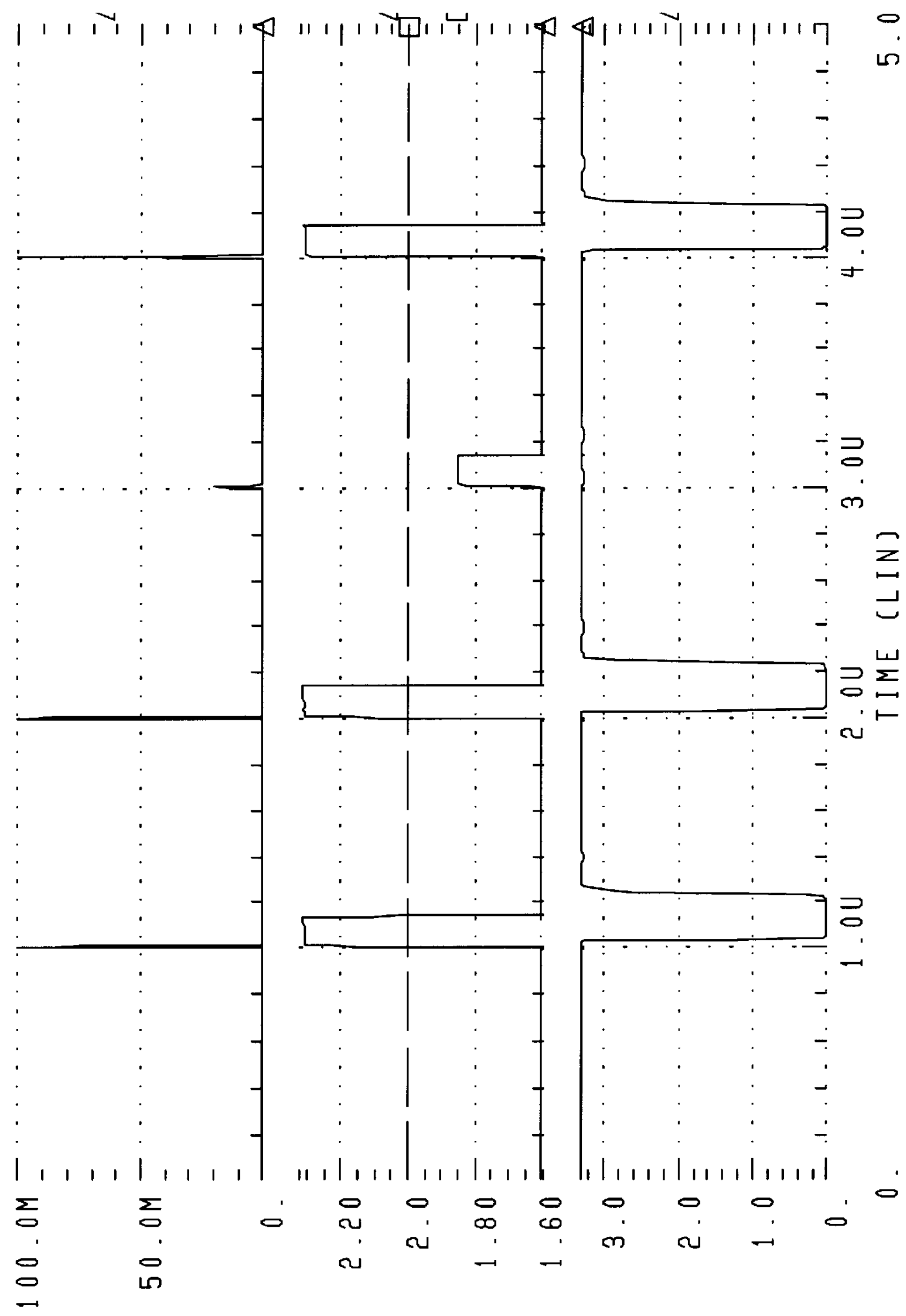
FIG. 4 is a graph showing the performance of the monitor. The top figure shows a dynamic or transient supply current as function of time, the middle figure shows a reference voltage of 2 V and the input voltage of the comparator, said input voltage being the voltage over the capacitance, and the bottom figure shows the output voltage of the comparator. The figure illustrates that at the time at which an open defect occurs, which results in a lower transient peak, the monitor or test device has a different output voltage.

For illustrative purposes, the proposed monitor was simulated using HSPICE. A simple CMOS circuit composed of NOR gates loaded with ten inverters, was used as the DUT. Due to the very small resistance of metal layer, the proposed monitor is able to measure very high transient currents without affecting the DUT's performance. For the assumed $R_{MET}$ value of 1Ω, the DUT supply voltage is lowered to 3.2V maximally for $I_{DD}$ currents up to 100 mA. The performance of the monitor for nominal parameters, room temperature and the $C_{charge}$ value of 0.5 nF is shown in FIG. 4. The waveforms from the top to the bottom are: the dynamic supply current $I_{DD}$, the comparator inputs $V_{in}$- and $V_{ref}$, and the output voltage of the monitor $V_{mon}$. At 3 μs, an open defect is sensed (the $V_{in-}$ voltage is lowered due to lower or missing transient current peak) and the monitor output $V_{mon}$ remains at 3.3V. Simulation results show that the design parameter affecting the monitor performance significantly is the sensing resistor $R_{MET}$ as its particular value determines the 'operating' current range for which the monitor gives accurate current monitoring. In other words, the sensing resistor determines the level of the mirrored current charging the capacitor $C_{charge}$ that leads to a respective voltage at the input of the differential amplifier. Table 1 demonstrates the accurate operating current ranges determined by the respective $R_{MET}$ values and current mirror sizes. That means that the value of $R_{MET}$ resistance should be set according to the particular current range being measured. If $R_{MET}$ value is smaller than 0.5Ω, the mirrored current $I_{MIR}$ is too small to charge the capacitor $C_{charge}$ (of reasonable value) in terms of a sufficient voltage drop at the comparator input. However, the considered range of $R_{MET}$ shown in Table 1 is satisfactory from both the measurable transient current as well as from the power supply degradation points of view.

TABLE 1

| $R_{MET}$ [Ω] | $W/L_{(MP1,MP2)}$ [μm] | Working range ($I_{DDT}$) |
|---|---|---|
| 0.5 | 240/2 | 30 mA to 100 mA |
| 1 | 240/2 | 10 mA to 50 mA |
| 2 | 360/2 | 1 mA to 10 mA |
| 3 | 240/2 | 500 μA to 5 mA |

Figure 5:
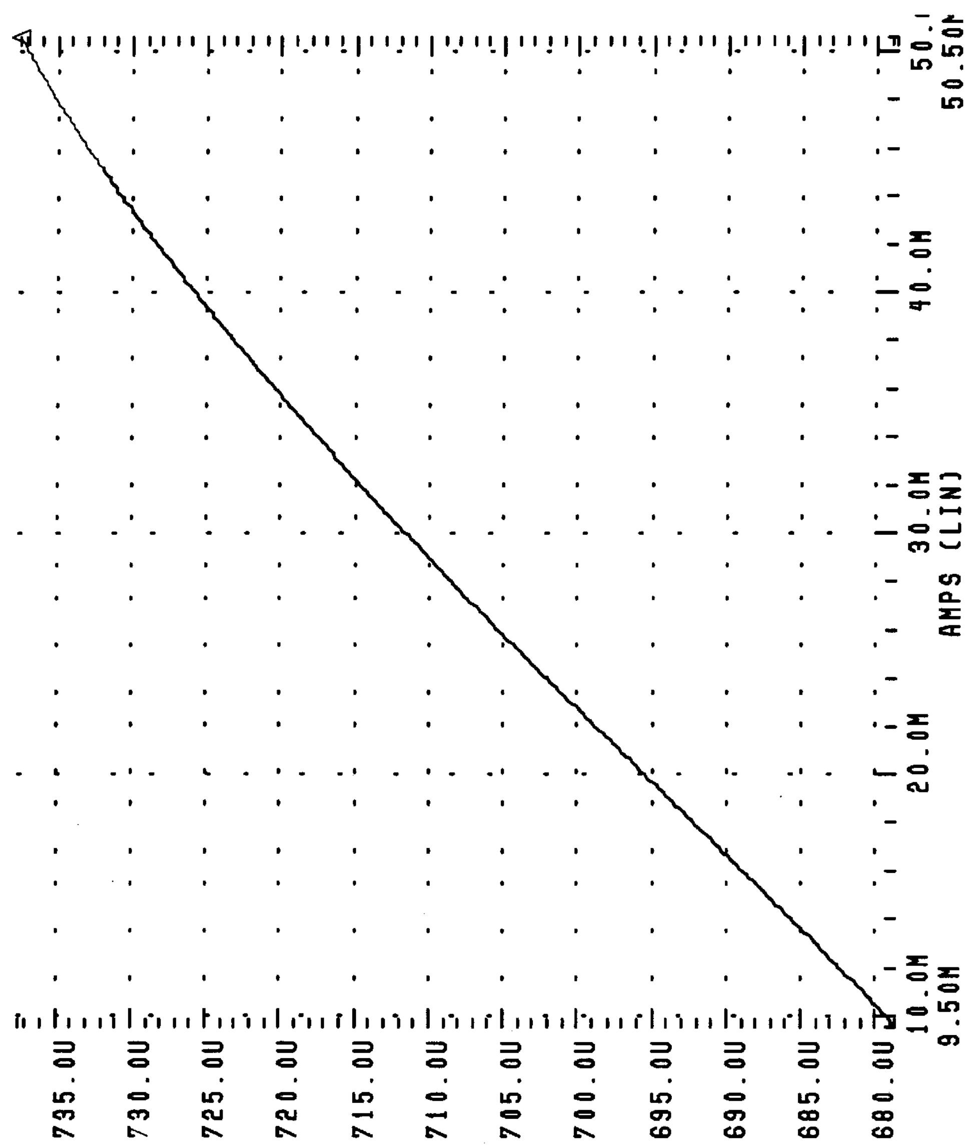
FIG. 5 is a graph showing the linearity of the current mirror. Shown in FIG. 5 is $R_{MET}$ of 1 Ω and $I_{DD}$ ranging from 10 mA to 50 mA.

Although, the diode D affects the linearity of the current monitor, the current measurement in a respective operating range is quite linear, as depicted in FIG. 5. Although the presented BIC monitor was illustrated above for transient current testing of digital circuits, the results achieved also indicate the possibility to use it, if modified in a proper way, for analog test applications. If the DUT is an analog circuit, then the supply current consumption is usually not negligible and an on-chip current monitor should handle high currents. Since most of the known monitors invoke unacceptable performance degradation due to significant voltage drop across the monitor, they are generally impractical for real applications. The invented principle does not create an additional voltage drop across the monitor than the one already caused by the parasitic resistance of the supply connection, even for very high supply currents. Thus, slightly modifying the BIC monitor offers a wide range of possibilities to dynamic testing of mixed-signal circuits.

Figure 6:
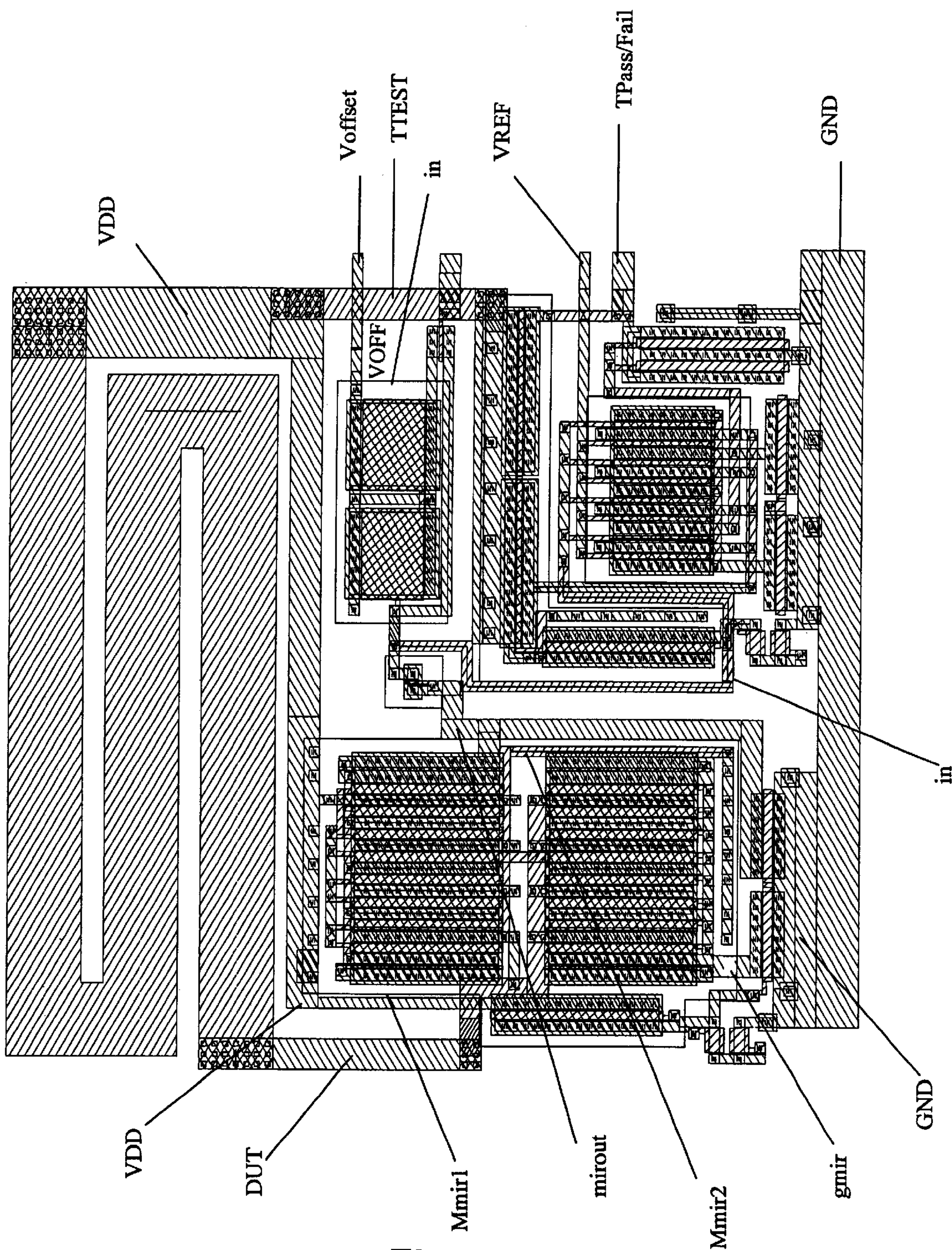
FIG. 6 shows the core of a transient built-in-current monitor layout.

The monitor circuit was implemented using the Alcatel-Mietec 0.7 μm CMOS technology. The layout was designed using the Cadence design tool. The core of the monitor layout is shown in FIG. 6. For the prototype chip series of the monitor, a 1 Ω $R_{MET}$ resistor is implemented using Metal2 layer, implying an area overhead of 160 μm×55 μm. Consequently, the total area of the transient BIC monitor is 170 μm×170 μm. However, in a practical application, the parasitic resistance of the DUT, power supply line is used to implement $R_{MET}$ and the total area overhead will be reduced or can even become neglectable if the monitor is placed under the supply routing.

Figure 7:
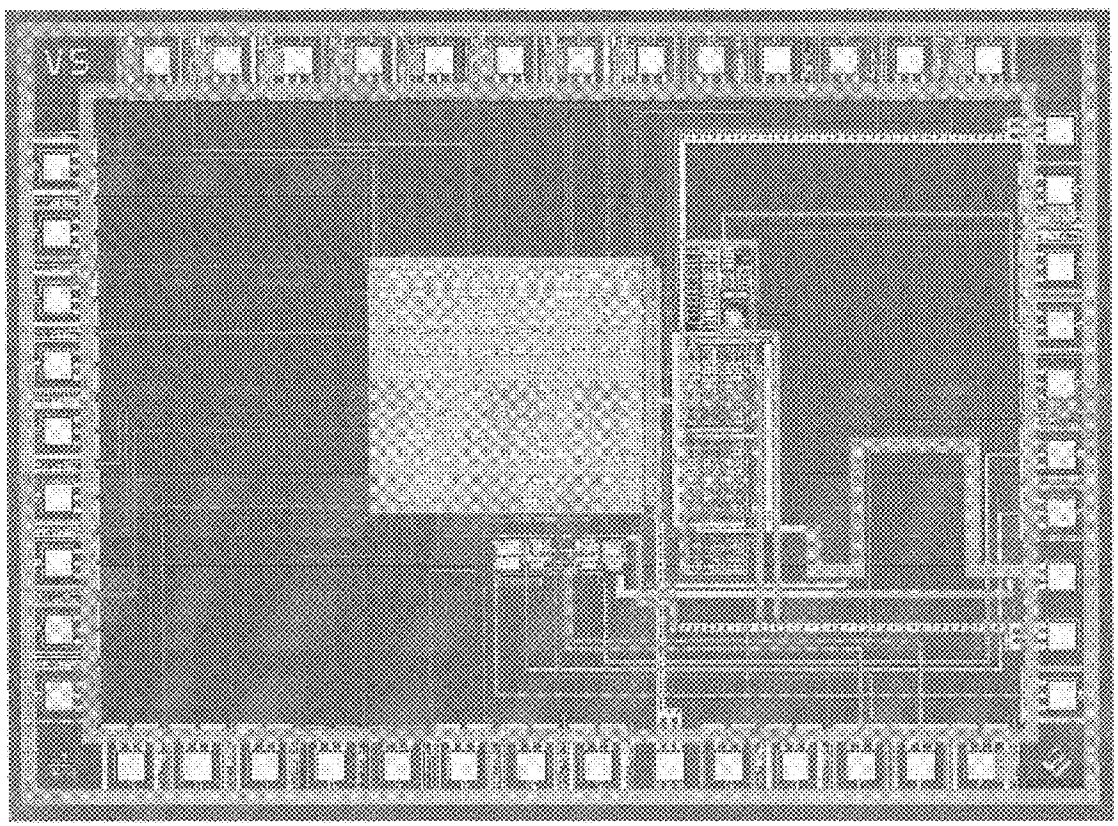
FIG. 7 shows a layout of the experimental design.

In order to verify feasibility and performance of the proposed circuit, the presented transient current monitor as well as a quiescent BIC monitor were implemented together with an experimental digital design (a two parallel 8-bit inputs multiplier) on a single chip. The layout of the whole experimental chip is depicted in FIG. 7. The chip area of the digital circuit itself is 850 μm×850 μm. In this implementation, the parasitic resistance of the power supply line of the DUT is used to sense the transient supply current. Therefore, the silicon area of the proposed monitor is reduced. The area of the transient monitor, placed under the circuit's power supply routing, is quite negligible 170 μm×140 μm regarding the total chip area that is rather huge because of total number of I/O pads. The design has been implemented together with an experimental CMOS circuit using Alcatel-Mietec 0.7 μm CMOS technology. The monitor is here designed for transient supply current measurements of low voltage 3.3V CMOS circuits. The sensor quantifies the current peaks in a wide measurement range, from several μA to 100 mA. Additionally a test rate of 1 MHz can be achieved.

In an embodiment of the invention, said test device (125) and said electronic device (10) can be integrated on one integrated circuit (130). Therefore said invention can be considered as, but is not limited to, on-chip testing.

In an embodiment of the invention a CMOS electronic device is tested. Said CMOS electronic device can be but is not limited to be a low-voltage CMOS integrated circuit.

In an embodiment, said test current, being monitored via said test device, is transient. As such, in said embodiment, said test device can be considered as a transient current monitor exploited for testing electronic devices. Said transient test current can also be denoted dynamic supply current.

In an embodiment of the invention, said methods and circuitry provide detection capabilities for open defects that usually cause a significant reduction of the dynamic or transient supply current.

Preferred embodiments of the present invention have been described herein. It is to be understood, however, that changes and modifications can be made without departing from the true scope and spirit of the present invention. The true scope and spirit of the present invention are defined by the following claims, to be interpreted in light of the foregoing specification.

What is claimed is:

1. A method for testing an electronic device using a testing device by measuring an electronic device current flowing in said electronic device, the testing device including a current mirror, the current mirror having a first branch and a second branch with one end of the first branch of the current mirror being connected to one point in the supply line and one end of the second branch being connected to a second point in the supply line, the supply line having resistance in between the one point and the second point, said method comprising the step of:

sending a supply current through the one point and through the second point in the supply line, the supply current including the electronic device current and the current through the first branch of the current mirror;

modifying operation of the first branch of the current mirror based on the supply current and the resistance;

generating an output current from the second branch of the current mirror, the output current based on the modifying of the operation of the first branch of the current mirror;

applying an offset voltage to a first node of a capacitive element;

charging said capacitive element with said output current; and generating an output voltage by comparing the voltage on a second node of said capacitive element with a reference voltage.

2. The method recited in claim 1, wherein the electronic device, the current mirror, and the circuitry for generating an offset voltage are in one integrated circuit; and wherein the output voltage is fed outside the one integrated circuit.

3. The method recited in claim 2, wherein the electronic device, the current mirror, and the circuitry for generating an offset voltage are in one integrated circuit.

4. The method recited in claim 2, wherein the output voltage is fed outside the one integrated circuit.

5. The method recited in 1, further comprising the step of discharging said capacitive element.

6. The method recited in 1, further comprising the step of repetitively charging and discharging of said capacitive element.

7. The method recited in claim 1, wherein said offset voltage prevents current flowing to said capacitive element when the electronic device is in quiescent state.

8. The method recited in claim 1, wherein said output voltage is generated for determining test conclusions about said electronic device.

9. The method recited in claim 1, wherein the reference voltage is user-selected.

10. The method recited in claim 1, further comprising the step of determining test conclusions about said electronic device from said output voltage.

11. A method for testing an electronic device using a testing device by measuring an electronic device current flowing in said electronic device, the testing device including a current mirror, the current mirror having a first branch and a second branch with one end of the first branch of the current mirror being connected to one point in the supply line and one end of the second branch being connected to a second point in the supply line, the supply line having resistance in between the one point and the second point, said method comprising the step of:

sending a supply current through the one point and through the second point in the supply line, the supply current including the electronic device current and the current through the first branch of the current mirror;

modifying operation of the first branch of the current mirror based on the supply current and the resistance;

generating an output current from the second branch of the current mirror, the output current based on the modifying of the operation of the first branch of the current mirror; and applying an offset voltage to a first node of a capacitive element, wherein the step of applying an offset voltage is performed by circuitry for generating an offset voltage.

12. The method recited in claim 11, wherein the step of modifying operation of the first branch of the current mirror includes modifying the voltage at the one end of the first branch of the current mirror.

13. The method recited in claim 11, further comprising the step of determining test conclusions about said electronic device from said output current.

14. The method recited in 11, wherein said supply current being transient.

15. The method recited in 11, wherein said electronic device is a CMOS device.

16. A test device for testing an electronic device by measuring a time varying supply current flowing in and drawn by said electronic device, said test device comprising in combination:

at least one current mirror, the current mirror having at least two branches, said branches each having at least having one end, the one end of the first branch being connected to a supply line of said electronic device at a first connection point, the one end of the second branch being connected to the supply line of said electronic device at a second connection point, said first and said second connection points being at different locations of the supply line; and circuitry for generating an offset voltage being applied to a first node of a capacitive element, said capacitive element being charged by said output current, wherein said current mirror is adapted for generating an output current, said output current being related to said supply current.

17. The test device recited in claim 16, further comprising:

means for measuring the voltage on a second node of said capacitive element with respect to a reference voltage, said means generating an output voltage.

18. The test device recited in claim 17, wherein said electronic device is on one integrated circuit, and further comprising means for feeding said output voltage outside of said one integrated circuit.

19. The test device recited in claim 18, wherein said output voltage is generated for determining test conclusions about said electronic device.

20. The test device recited in claim 17, further comprising means for discharging said capacitive element.

21. The test device recited in claim 16, wherein the supply line between first connection point and the second connection point has a parasitic resistance.

22. The test device recited in claim 16, wherein said output current is used for determining test conclusions about said electronic device.

23. The test device recited in claim 16, wherein said test device is integrated with said electronic device on one integrated circuit.

24. The test device recited in claim 13 being adapted for testing said electronic device, being a CMOS device.

25. The test device recited in claim 16, wherein said supply current is a transient current.

26. The test device recited in claim 16, wherein each branch of said current mirror has a current source.

27. The test device recited in claim 16, wherein said offset voltage prevents current flowing to said capacitive element when the electronic device is in quiescent state.

* * * * *